US007678516B2

(12) United States Patent
Monahan et al.

(10) Patent No.: US 7,678,516 B2
(45) Date of Patent: Mar. 16, 2010

(54) TEST STRUCTURES AND METHODS FOR MONITORING OR CONTROLLING A SEMICONDUCTOR FABRICATION PROCESS

(75) Inventors: Kevin Monahan, Cupertino, CA (US); Brad Eichelberger, Dillsburg, PA (US); Ady Levy, Sunnyvale, CA (US)

(73) Assignee: KLA-Tencor Technologies Corp., Milpitas, CA (US)

( * ) Notice: Subject to any disclaimer, the term of this patent is extended or adjusted under 35 U.S.C. 154(b) by 1082 days.

(21) Appl. No.: 11/187,609

(22) Filed: Jul. 22, 2005

(65) Prior Publication Data
US 2006/0024850 A1 Feb. 2, 2006

Related U.S. Application Data

(60) Provisional application No. 60/590,234, filed on Jul. 22, 2004.

(51) Int. Cl.
*G03F 7/00* (2006.01)
*G01R 31/26* (2006.01)
*H01L 21/66* (2006.01)

(52) U.S. Cl. .............................. 430/22; 430/5; 430/30; 430/322

(58) Field of Classification Search ................... 430/30, 430/5, 311, 22
See application file for complete search history.

(56) References Cited

U.S. PATENT DOCUMENTS

| 5,300,786 | A  | 4/1994  | Brunner et al.  |
|-----------|-----|---------|-----------------|
| 5,629,772 | A  | 5/1997  | Ausschnitt      |
| 6,440,616 | B1 | 8/2002  | Izuha et al.    |
| 6,577,406 | B2 | 6/2003  | Bruce et al.    |
| 6,667,139 | B2 | 12/2003 | Fujisawa et al. |
| 6,689,519 | B2 | 2/2004  | Brown et al.    |
| 6,710,853 | B1 | 3/2004  | La Fontaine et al. |

(Continued)

FOREIGN PATENT DOCUMENTS

WO          02/19415           3/2002

(Continued)

OTHER PUBLICATIONS

Hannon et al., "Product-Wafer Focus-Exposure Monitor for Advanced Flash Memory," presented at ISSM 2003, 4 pages.

(Continued)

*Primary Examiner*—Kathleen Duda
*Assistant Examiner*—Caleen O Sullivan
(74) *Attorney, Agent, or Firm*—Ann Marie Mewherter

(57) ABSTRACT

Various test structures and methods for monitoring or controlling a semiconductor fabrication process are provided. One test structure formed on a wafer as a monitor for a lithography process includes a bright field target that includes first grating structures. The test structure also includes a dark field target that includes second grating structures. The first and second grating structures have one or more characteristics that are substantially the same as one or more characteristics of device structures formed on the wafer. In addition, the test structure includes a phase shift target having characteristics that are substantially the same as the characteristics of the bright field or dark field target except that grating structures of the phase shift target are shifted in optical phase from the first or second grating structures. One or more characteristics of the targets can be measured and used to determine parameter(s) of the lithography process.

27 Claims, 5 Drawing Sheets

U.S. PATENT DOCUMENTS

| | | |
|---|---|---|
| 2002/0182516 A1 | 12/2002 | Bowes |
| 2003/0021465 A1 | 1/2003 | Adel et al. |
| 2003/0021466 A1 | 1/2003 | Adel et al. |
| 2003/0021467 A1 | 1/2003 | Adel et al. |
| 2003/0026471 A1 | 2/2003 | Adel et al. |
| 2003/0219655 A1 | 11/2003 | Sutani et al. |
| 2003/0223630 A1 | 12/2003 | Adel et al. |

FOREIGN PATENT DOCUMENTS

| | | |
|---|---|---|
| WO | 03/071471 | 8/2003 |

OTHER PUBLICATIONS

Monahan et al., "Lithographic focus stabilization for model-based gate CD control systems," presented at ISSM 1998, 4 pages.

Christopher P. Ausschnitt, "Distinguishing dose from defocus for in-line lithography control," SPIE vol. 3677, Mar. 1999, pp. 140-147.

TEST STRUCTURES AND METHODS FOR MONITORING OR CONTROLLING A SEMICONDUCTOR FABRICATION PROCESS

PRIORITY CLAIM

This application claims priority to U.S. Provisional Application No. 60/590,234 entitled "Test Structures and Methods for Monitoring or Controlling a Semiconductor Fabrication Process," filed Jul. 22, 2004, which is incorporated by reference as if fully set forth herein.

BACKGROUND OF THE INVENTION

1. Field of the Invention

The present invention generally relates to test structures and methods for monitoring or controlling a semiconductor fabrication process. Certain embodiments relate to a test structure formed on a wafer or a reticle as a monitor for lithography and/or etch processes.

2. Description of the Related Art

The following description and examples are not admitted to be prior art by virtue of their inclusion in this section.

Fabricating semiconductor devices such as logic and memory devices typically includes processing a substrate such as a semiconductor wafer using a number of semiconductor fabrication processes to form various features and multiple levels of the semiconductor devices. For example, lithography is a semiconductor fabrication process that involves transferring a pattern from a reticle to a resist arranged on a semiconductor wafer. Additional examples of semiconductor fabrication processes include, but are not limited to, chemical-mechanical polishing, etch, deposition, and ion implantation. Multiple semiconductor devices may be fabricated in an arrangement on a semiconductor wafer and then separated into individual semiconductor devices.

As the dimensions of advanced semiconductor devices continue to shrink, process control windows are shrinking commensurately. A necessary condition for smaller design rules is the control of edge placement error (EPE). EPE can be measured as two components: critical dimension error (CDE) and pattern placement error (PPE). Both are affected by other process errors, such as lithographic dose and focus excursions, that are not measured directly by CD and overlay metrology tools. These excursions constitute a form of "hidden" error that can complicate attempts to control the lithography process. As an example, focus windows are expected to shrink from about 400 nm at the 130 nm technology node to less than 100 nm at the 65 nm node, and focus error will cause more than 50% of the CD variation.

Focus and exposure impact CD control interactively. A focus excursion at the gate level, for example, can increase both the "effective dose" and the sensitivity of the CD to small changes in dose. Focus error can defeat dose-based advanced process control (APC) algorithms by corrupting both the reference level and the slope of the dose-to-CD calibration. In addition, focus errors are a known source of sidewall angle and resist height variations that can propagate into etch, and cause "feature-limited" yield loss.

Gate CD and profile control in lithography is a particularly important APC application. For example, gate CDs and profiles control the speed binning and average selling price of advanced microprocessors, and they can have a profound effect on factory revenues. In the microprocessor case, model-based gate control loops have been shown to add as much as $2,000,000 per 1000 wafer starts. As a consequence, another component of yield (bin yield) is gaining importance. Bin yield is based on parametric performance, so control of bin yield relies more on wafer metrology than on defect inspection. Thus, in the era of accelerated shrinks and early introduction of technology nodes, yield control is driving the use of in-line metrology tools.

Accordingly, monitor and control of semiconductor processes is and will continue to be of significant importance in semiconductor development and manufacturing. Furthermore, the ability of test structures or process monitoring methods to not only detect a process excursion but to be responsive to the degree of excursion will determine how well semiconductor fabrication processes can be monitored. In addition, the degree to which the test structures and results of the process monitoring can be used to correct process excursions may, in large part, determine how successfully semiconductor fabrication processes can be performed. Consequently, significant efforts have been and will continue to be made to improve the test structures that can be used to monitor semiconductor fabrication processes.

Previously used methods include line-end shortening (LES) methods such as those developed by IBM. LES of resist features is an indicator of process window for both dose and focus. Examples of such methods and target structures used in these methods are illustrated in U.S. Pat. No. 5,629,772 to Ausschnitt and U.S. Pat. No. 6,577,406 to Bruce et al., which are incorporated by reference as if fully set forth herein. Prior work described by Ausschnitt and Bruce et al. has demonstrated the use of control targets that leverage the effect of LES.

An example of one such control target is commonly referred to as a "schnitzl." Such a target generally includes a pair of line arrays on a clear background adjacent to a pair of trough or space arrays on a resist background. The lines and spaces have the same design size and layout. The distance between the two line arrays (L) and the two space arrays (S) becomes the control metric. Typically, the line width and pitch of the individual target lines are comparable to the minimum feature on the chip. Commonly, this method has a non-monotonic response to defocus, making it useful as an excursion monitor, but unreliable as feedback for APC systems. In addition, these methods are time consuming since they require measuring additional targets that are specialized for this task alone.

A different example of previously used methods includes phase-shift-focus (PSF) methods such as those developed by IBM. In general, using phase shifting masks, errors in the phase of the mask (non-180° shifters) would cause asymmetries of the printed image as the image was defocused. These asymmetries create a translational offset in the printed image as a function of the focus offset. The phase-shift-focus reticle employs this effect for stepper diagnostics and calibration. In the simplest implementation, a bar-in-bar overlay target is written on a reticle. Both the inner and outer bars are printed at the same time, with part of the target phase shifted by 90° and the other part unshifted. If the stepper is perfectly focused, the overlay error will be exactly zero in both x and y. If there is a focus error, the phase-shifted half of the overlay target will move relative to the unshifted part, and the resulting overlay error is a direct measure of the focus error. Examples of such PSF methods and targets are illustrated in U.S. Pat. No. 5,300,786 to Brunner et al., U.S. Pat. No. 6,667,139 to Fujisawa et al., and U.S. Pat. No. 6,710,853 to LaFontaine et al., which are incorporated by reference as if fully set forth herein.

These methods have achieved some measure of success in recent years. For example, the PSF method exhibits a linear response to defocus, thereby eliminating the "deadband" or flat zone observed in standard CD versus focus plots and enabling the use of proportional control. In addition, the PSF method allows targeting of defocus values with a resolution of about 10 nm. Furthermore, the PSF monitor patterns can be measured using a high throughput, optical overlay tool, thereby minimizing the time to data, analysis, and corrective action.

There are, however, several disadvantages to these methods. For example, these methods are based upon obsolete box-in-box target technology that is not robust during mask fabrication or wafer processing. Furthermore, because of their large size, these box-in-box targets fail to replicate effects of lithographic parameters such as lithographic lens aberrations on relatively small design rules. Therefore, traditional metrology marks are not sensitive to the same aberrations as the transistors.

There have been recent disclosures, however, which attempt to deal with this issue by making box-in-box targets, which are more device representing (or device-like) and process-robust. For ease of discussion, a "device representing" target may be defined as a target that is sensitive to the same aberrations as a particular size and pitch of the transistor. Large open spaces are also subject to the adverse effects of other processes (besides lithography) such as chemical-mechanical polishing and deposition. Further, "process-robust" targets may be defined as targets that are not adversely affected by these spurious processes. As a result, the targets are typically not optimized for the process, and therefore the fine structures of the targets may suffer from process induced biases when measured by a metrology tool. In addition, targets, which are large and cumbersome compared to actual device features being printed therewith, can be used to produce correctables, which are based on measurements thereof, that may not be ideal, or even suitable, for the process.

Accordingly, it may be advantageous to develop test structures and methods for monitoring or controlling a semiconductor fabrication process such as a lithography process that yield substantially monotonic and linear responses to variations in parameters of the process such as focus errors and that replicate the effects of process parameters on relatively small design rules.

SUMMARY OF THE INVENTION

The following description of various embodiments of test structures and methods is not to be construed in any way as limiting the subject matter of the appended claims.

At or near design rule, phase-shift-focus monitors have been developed using novel targets on lithographic reticles. These targets image on a semiconductor wafer in such a way as to enable determination of lithographic focus and/or exposure. Lithographic focus and exposure may also be determined simultaneously using the targets described herein. Unlike alternative solutions, the embodiments described herein and variants thereof work at or near design rules for devices and therefore are more robust to variations in mask fabrication and wafer fabrication while providing a more accurate response to scanner lens aberration and other relevant lithographic parameters.

One embodiment relates to a test structure formed on a wafer as a monitor for a lithography process. The test structure includes a bright field target that includes first grating structures. The test structure also includes a dark field target that includes second grating structures. The first and second grating structures have one or more characteristics that are substantially the same as one or more characteristics of device structures formed on the wafer. In addition, the test structure includes a phase shift target having characteristics that are substantially the same as the characteristics of the bright field or dark field target except that grating structures of the phase shift target are shifted in optical phase from the first or second grating structures. In one embodiment, the grating structures of the phase shift target may include sets of segmented structures. One or more of the characteristics of the bright field, dark field, and phase shift targets can be measured and used to determine one or more parameters of the lithography process.

In one embodiment, the one or more characteristics of the first and second grating structures that are substantially the same as the one or more characteristics of the device structures include lateral dimension. In this manner, the bright field target and the dark field target include at or near design rule structures. In another embodiment, the one or more parameters of the lithography process that may be determined include dose, focus, or dose and focus. In some embodiments, the one or more parameters of the lithography process that may be determined include focus in the x direction and focus in the y direction.

In additional embodiments, one of the characteristics of the phase shift target subtracted from one of the characteristics of the bright field target or the dark field target yields a response that is substantially monotonic in focus of the lithography process. In another embodiment, one of the characteristics of the phase shift target subtracted from one of the characteristics of the bright field target or the dark field target yields a response that varies substantially linearly with focus of the lithography process. In yet another embodiment, the one or more characteristics of the bright field target and the dark field target can be used to determine dose of the lithography process. In such an embodiment, the one or more characteristics of the phase shift target and the bright field or dark field target can be used to determine focus of the lithography process.

In one embodiment, the one or more characteristics of the bright field, dark field, and phase shift targets can be used to determine correction terms for the one or more parameters of the lithography process. In another embodiment, the one or more characteristics of the bright field, dark field, and phase shift targets can be used to determine one or more parameters of an etch process. In a further embodiment, the one or more characteristics of the bright field, dark field, and phase shift targets can be used to determine correction terms for one or more parameters of an etch process. Each of the embodiments of the test structure described above may be further configured as described herein.

Another embodiment relates to a test structure formed on a reticle as a monitor for a lithography process. The test structure includes a bright field target that includes first grating structures. The test structure also includes a dark field target that includes second grating structures. The first and second grating structures have one or more characteristics that are substantially the same as one or more characteristics of device structures formed on the reticle. In addition, the test structure includes a phase shift target having characteristics that are substantially the same as the characteristics of the bright field or dark field target except that grating structures of the phase shift target are shifted in optical phase from the first or second grating structures. In one embodiment, the grating structures of the phase shift target include sets of segmented structures. One or more of the characteristics of the bright field, dark field, and phase shift targets can be measured and used to determine one or more parameters of the lithography process. Each of the embodiments of the test structure described above may be further configured as described herein.

An additional embodiment relates to a method for monitoring a lithography process. The method includes measuring one or more characteristics of a test structure formed on a wafer using the lithography process. The test structure includes a bright field target that includes first grating structures. The test structure also includes a dark field target that includes second grating structures. The first and second grating structures have one or more characteristics that are substantially the same as one or more characteristics of device structures formed on the wafer. In addition, the test structure includes a phase shift target having characteristics that are substantially the same as the characteristics of the bright field or dark field target except that grating structures of the phase shift target are shifted in optical phase from the first or second grating structures. The method also includes determining one or more parameters of the lithography process from the one or more characteristics of the test structure.

In one embodiment, the method may include determining correction terms for the one or more parameters of the lithography process from the one or more characteristics of the test structure. In another embodiment, the method may include altering the one or more parameters of the lithography process using a feedback control technique. The one or more parameters of the lithography process that are determined may include focus error. However, the one or more parameters of the lithography process may also or alternatively include dose error or dose and focus error. Each of the embodiments of the method described above may include any other step(s) described herein.

A further embodiment relates to a method for controlling an etch process. The method includes measuring one or more characteristics of a test structure formed on a wafer using a lithography process. The test structure includes a bright field target that includes first grating structures. The test structure also includes a dark field target that includes second grating structures. The first and second grating structures have one or more characteristics that are substantially the same as one or more characteristics of device structures formed on the wafer. In addition, the test structure includes a phase shift target having characteristics that are substantially the same as the characteristics of the bright field or dark field target except that grating structures of the phase shift target are shifted in optical phase from the first or second grating structures. The method also includes determining one or more parameters of the etch process from the one or more characteristics of the test structure.

In one embodiment, the method may include determining correction terms for the one or more parameters of the etch process from the one or more characteristics of the test structure. In another embodiment, the method may include altering the one or more parameters of the etch process using a feedforward control technique. In yet another embodiment, the method may include determining expected critical dimension error of the etch process that will be caused by focus error of the lithography process. Each of the embodiments of the method described above may include any other step(s) described herein.

Yet another embodiment relates to a different test structure that is formed on a wafer as a monitor for a lithography process. The test structure includes an outer region that includes line end shortening structures. One or more characteristics of the line end shortening structures can be measured and used to determine one or more parameters of the lithography process. The test structure also includes an inner region that includes current layer structures. One or more characteristics of the current layer structures can be measured and used in combination with one or more characteristics of previous layer structures formed in an inner region of an additional test structure formed on the wafer to determine pattern overlay.

In one embodiment, the one or more characteristics of the line end shortening structures and the current layer structures can be measured to simultaneously determine the one or more parameters of the lithography process and the pattern overlay. In another embodiment, the one or more parameters of the lithography process include lithographic dose and lithographic defocus.

In some embodiments, the line end shortening structures include bright field line end shortening structures and dark field line end shortening structures. In another embodiment, the line end shortening structures are oriented in the x and y directions. In an additional embodiment, the line end shortening structures include line end shortening structures having different pitches, different duty cycles, or different pitches and different duty cycles.

In one embodiment, the one or more characteristics of the line end shortening structures and the current layer structures can be measured using an optical imaging overlay metrology tool. In another embodiment, the test structure is formed inside of a semiconductor device area on the wafer. In some embodiments, the one or more characteristics of the line end shortening structures and the current layer structures are substantially the same as one or more characteristics of dummy structures formed on the wafer. Each of the embodiments of the test structure described above may be further configured as described herein.

BRIEF DESCRIPTION OF THE DRAWINGS

Further advantages of the present invention may become apparent to those skilled in the art with the benefit of the following detailed description of the preferred embodiments and upon reference to the accompanying drawings in which.

Figure 1:
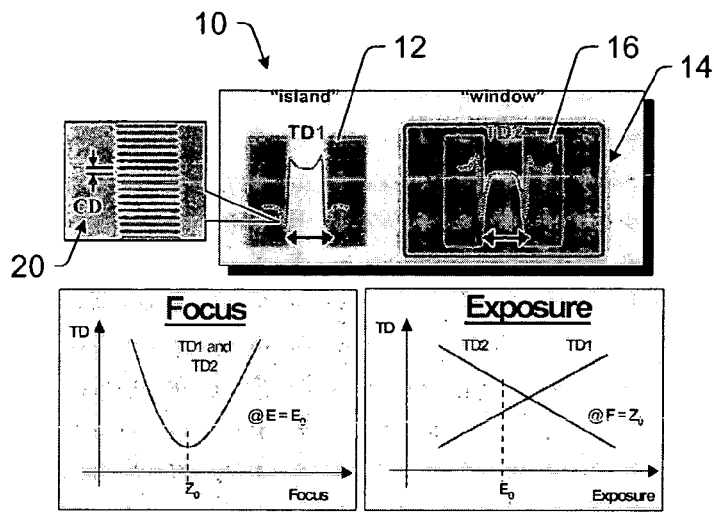
FIGS. 1 and 2 are schematic diagrams illustrating previously used test structures.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

As used herein, the term "wafer" generally refers to a substrate formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

A wafer may include only the substrate, which may be commonly referred to as a "virgin wafer." Alternatively, a wafer may include one or more layers formed upon a substrate. For example, such layers may include, but are not limited to, a resist, a dielectric material, and a conductive material. A resist may include any material that may be patterned by an optical lithography technique, an e-beam lithography technique, or an X-ray lithography technique. Examples of a dielectric material include, but are not limited to, silicon dioxide, silicon nitride, silicon oxynitride, and titanium nitride. Additional examples of a dielectric material include "low-k" dielectric materials such as Black Diamond™ which is commercially available from Applied Materials, Inc., Santa Clara, Calif., and CORAL™ commercially available from Novellus Systems, Inc., San Jose, Calif., "ultra-low k" dielectric materials such as "xerogels," and "high-k" dielectric materials such as tantalum pentoxide. In addition, examples of a conductive material include, but are not limited to, aluminum, polysilicon, and copper.

One or more layers formed on a wafer may be patterned or unpatterned. For example, a wafer may include a plurality of dies having repeatable pattern features. Formation and processing of such layers of material may ultimately result in completed semiconductor devices. As such, a wafer may include a substrate on which not all layers of a complete semiconductor device have been formed or a substrate on which all layers of a complete semiconductor device have been formed. The term "semiconductor device" is used interchangeably herein with the term "integrated circuit." In addition, other devices such as microelectromechanical (MEMS) devices and the like may also be formed on a wafer.

A "reticle," or a "mask," is generally defined as a substantially transparent substrate having substantially opaque regions formed thereon and configured in a pattern. The substrate may include, for example, a glass material such as quartz. The substantially opaque regions may be formed of a material such as chromium. A reticle may be disposed above a resist-covered wafer during an exposure step of a lithography process such that the pattern on the reticle may be transferred to the resist. For example, substantially opaque regions of the reticle may protect underlying regions of the resist from exposure to an energy source. Many different types of reticles are known in the art, and the term reticle as used herein is intended to encompass all types of reticles.

Turning now to the drawings, FIG. 1 illustrates a test structure that has been previously used to monitor a lithography process. In particular, the target can be used as a focus-exposure monitor, which is commonly referred to as "MPX," that works with existing overlay metrology tools (such as the Archer family of tools, which are commercially available from KLA-Tencor, San Jose, Calif.) and uses simple binary mask targets printed on product wafers. MPX is an outgrowth of the Ausschnitt line-end-shortening (LES) technology described above. As shown in FIG. 1, this test structure includes bright field target 10 that includes grating structures 12. This test structure also includes dark field target 14 that includes grating structures 16. As such, the methodology uses grating targets consisting of arrays of lines and spaces at or near the critical dimension of the device layer. This technique takes advantage of line-end-shortening of array targets in brightfield "islands" or darkfield "windows," respectively.

The bright field target and the dark field target are measured to produce target dimension 1 (TD1) and target dimension 2 (TD2), respectively. TD1 and TD2 may be measured on an overlay metrology tool. TD1 and TD2 are much more sensitive to focus-exposure errors than critical dimension (CD) linewidths. Relative to CD, which is shown in FIG. 1 by reference numeral 20, line-end-shortening can be several times more sensitive to focus-exposure changes. The use of two target dimensions allows simultaneous determination of the focus-exposure conditions on product wafers.

As shown in the plot of the target dimensions versus focus in FIG. 1, the target dimensions are non-linear in focus. In particular, the behavior of both target dimensions (TD1 and TD2) is approximately parabolic through focus. Therefore, a target dimension measurement may yield multiple solutions for focus. As such, the focus may be incorrectly determined from the measured target dimensions. In addition, the sensitivity of the measurements changes across focus. However, accounting for the sign of focus offset, focus prediction may be linear. In contrast, as shown in FIG. 1 in the plot of the target dimensions versus exposure, the targets dimensions are approximately linear through small ranges of exposure dose. Therefore, measurements of the target dimensions of the bright field target and/or the dark field target may be used to determine exposure dose of a lithography process. In addition, a single pair of TD measurements can be used to determine exposure dose to within about 1% and focus offset to within about 50 nm.

Use of two target dimensions allows simultaneous determination of focus-exposure conditions on product wafers. Each TD is calibrated using off-line focus-exposure matrices (FEMs) and an empirical model. The sensitivity of the target dimensions to focus-exposure variation decreases with CD and increases with pitch, subject to the limits of printability.

Figure 2:
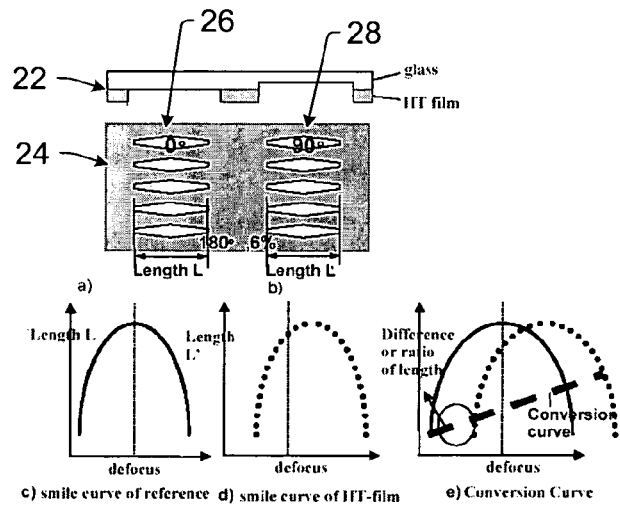

FIG. 2 illustrates another test structure that has been used to monitor a lithography process. As shown in cross-sectional view 22 of a mask and top-down view 24 of the mask, the mask includes a first pattern region having at least one first monitor pattern which is constituted by a first opening surrounded by a first film or constituted by the first film surrounded by the first opening, and a second pattern region having at least one second monitor pattern which is constituted by a second opening surrounded by a second film or constituted by the second film surrounded by the second opening, and is capable of giving a predetermined phase difference to an exposure light passing through the second film relative to an exposure light passing through the second opening. In addition, the first and second monitor patterns have a configuration in which both ends are tapered from a central portion. In particular, as shown in FIG. 2, the test structure on the mask includes two sets of rhomboids. For example, the mask may include first set 26 of rhomboids and second set 28 of rhomboids, which are alike in many ways, e.g., dimensions, pitch, shape, aspect ratio, etc., except that second set 28 is shifted in phase by 90° compared to first set 26.

The test structure is printed on a wafer, and the length L of the first set of rhomboids and the length L' of the second set of rhomboids is measured. A plot of Length L versus defocus as shown in FIG. 2 is relatively parabolic in nature and is commonly referred to as a "smile curve." A plot of length L' versus defocus as shown in FIG. 2 is also relatively parabolic in nature and, therefore, is also commonly referred to as a "smile curve." Although the two plots are non-linear in defocus, the difference or ratio of the two lengths (L and L') may be generated and plotted as a conversion curve as shown in FIG. 2. The conversion curve is linear in focus. Therefore, the measured lengths L and L' may be used to generate a conversion curve, which in turn can be used to determine focus of a lithography process. However, the test structure shown in FIG. 2 cannot be used to determine exposure dose of a lithography process. Although FIG. 2 illustrates the test structure and method of use in general terms, additional description of such test structures and methods can be found in U.S. Pat. No. 6,440,616 to Izuha et al., which is incorporated by reference as if fully set forth herein.

Although the test structures described above provide some measurements that can be used to determine one or more parameters of a lithography process, the test structures are lacking in some ways. In particular, the test structure shown in FIG. 1 provides a non-linear response to focus. In addition, the test structure shown in FIG. 2, although linear in focus, does not provide a measurement that can be used to determine exposure dose of a lithography process. Therefore, compared to existing test structures and concepts, the test structure embodiments described herein provide at or near design rule responses and simultaneous focus determinations (in both the x and y directions) with the precision, accuracy, and process robustness associated with advanced target structures. Process robustness issues generally refer to restrictions that are created by the materials and processes that are used to form the layers and patterns on the wafer such as, for example, etching, deposition, chemical-mechanical polishing (CMP) and the like.

Figure 3:
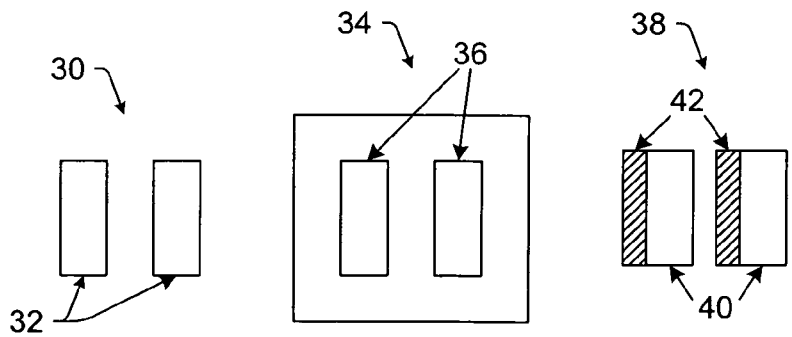
FIGS. 3-5 are schematic diagrams illustrating plan views of various embodiments of a test structure formed on a wafer or a reticle as a monitor for a process.

One embodiment of such a test structure is illustrated in FIG. 3. The test structure may be formed on a wafer or a reticle. For example, the test structure may be formed on a reticle using any reticle fabrication process(es) known in the art. In addition, the fabricated reticle may then be used to print the test structure on a wafer. The test structure may be printed on the wafer using any lithography process(es) known in the art. The test structure may be used as a monitor for a lithography process. In particular, the test structure may be used as a monitor for a lithography process that was used to print the test structure on the wafer. In addition, the test structure may be used in other methods as described herein. For example, measurements of the test structure may be used to control an etch process.

As shown in FIG. 3, the test structure includes bright field target 30 that includes first grating structures 32. The test structure also includes dark field target 34 that includes second grating structures 36. The first and second grating structures have one or more characteristics that are substantially the same as one or more characteristics of device structures (not shown) formed on the wafer or the reticle. In particular, the first and second grating structures have at least one characteristic that is substantially the same as a characteristic of the device structures. For example, the first and second grating structures may have the same lateral dimension(s), pitch, shape, or some combination thereof as the device structures. The device structures may include any device structures known in the art. Typically, the device structures are formed on a reticle or a wafer in a location that is at least somewhat spaced from that of the test structure. However, the device structures on a reticle are usually printed on a wafer at approximately the same time as printing of the test structure (e.g., in the same scan). In addition, since the test structure has a relatively small size, the test structure may be formed in a device area on the reticle or wafer.

The test structure also includes phase shift target 38, which has characteristics that are substantially the same as one or more characteristics of the bright field or dark field target except that grating structures 40 of the phase shift target are shifted in optical phase from the first or second grating structures. Therefore, the phase shift target includes phase targets as part of the grating structures. Grating structures 40 may be shifted in phase by embedding chrome/phase structures 42 inside the width of the grating structures. Typically, the chrome/phase structures may have a pitch that is an integral divisor of the nominal width of the grating structures although this is not required. The grating structures may be shifted in optical phase from the grating structures that they mimic by a fixed number of degrees (e.g., about 90° to about 180°).

The test structure shown in FIG. 3, therefore, includes at least three target structures rather than two like those shown in FIGS. 1 and 2. The three target structures may include LES type grating structures. In addition, the grating structures of the three targets may be line structures in the case of the bright field grating structures and spaces or troughs in the case of the dark field grating structures. However, the shape of the grating structures may vary depending upon, for example, the shape of device structures that are also formed on the wafer or reticle. Furthermore, a width of grating structures may be about 1000 nm. However, the width of the structures may vary depending on the width of the device structures that are also formed on the wafer or the reticle. In addition, although each of the target structures are shown in FIG. 3 to include two grating structures, it is to be understood that that the targets may include any number of grating structures. Furthermore, the target structures may include non-grating structures.

One reason that smaller grating structures provide more accurate focus error and/or dose error measurements is that smaller sized grating structures are formed on the wafer with pattern placement errors that are more similar to the lens pattern placement errors with which the patterns for the device structures of integrated circuits are formed. Patterns are formed on wafers with lithographic devices such as "steppers." The lens placement errors of patterns formed upon a semiconductor wafer change with the size and spacing of the patterns due to aberrations within the stepper lenses and with the illumination conditions (including off-axis illumination and partial coherence) used to expose the circuit pattern defined on the mask. Creating test structures having feature size and pitch more comparable to that of the integrated circuit device structure critical dimensions, as well as using the same or similar mask pattern techniques as the device structures (e.g., using the same or similar optical proximity correction or phase shift mask patterns), results in test structure and integrated circuit patterns that are formed with a more similar degree of lens pattern placement errors. In this manner, the measurement of the test structures gives a more accurate indication of the focus and/or dose errors of a lithography process.

One or more characteristics of the bright field, dark field, and phase shift targets can be measured and used to determine one or more parameters of the lithography process. The measurements may include LES type measurements described above. The one or more parameters of the lithography process that are determined may include dose and/or focus. For example, the first two targets may be used to determine lithographic dose independently and may act as a secondary focus excursion monitor using measurements of the bright field target (e.g., TD1) and the dark field target (TD2). In other words, one or more characteristics of the bright field and dark field targets can be used to determine dose of the lithography process, and one or more characteristics of the phase shift target and the bright field or dark field target can be used to determine focus of the lithography process. In this manner, the test structure shown in FIG. 3 may be commonly referred to as a MPX phase-shift-focus (PSF) target.

The measurements of the two targets may be performed as described above (e.g., using an overlay metrology tool such as one of the Archer tools). Alternatively, the measurements of the two targets may be performed using another metrology technique known in the art (e.g., critical dimension scanning electron microscopy (CD SEM), optical imaging, etc.). The phase shift target, which may be a bright field target or a dark field target, may be shifted in optical phase as described above. A third measurement may be made of the phase shift target (e.g., TD3). Using the test structure shown in FIG. 3, the defocus is measured as an overlay translation error of the phase shift target with respect to a reference structure (e.g., the bright field or dark field target) that is either not phase shifted or phase shifted so that its image displacement is in the opposite direction. In this manner, if the stepper is perfectly focused, the overlay error will be exactly zero in both x and y directions. If there is a focus error, the phase-shifted target of the test structure will be moved relative to the un-shifted reference target, and the resulting overlay error is a direct measure of the focus error.

The test structure may also be configured such that the phase shift target is shifted in one or two lateral directions (x and/or y). Therefore, the one or more parameters of the lithography process that are determined may include focus in the x-direction and focus in the y-direction, which may be determined as an overlay translation error of the phase shift target with respect to the reference structure that is either not phase shifted or phase shifted so that its image displacement is opposite that of the phase shift target in two directions.

One particular advantage of the test structures described herein is that since the LES-type measurements are nearly quadratic in response to defocus, subtraction of the measurement of the shifted target from the measurement of the un-shifted target results in a combined target that is substantially monotonic and/or nearly linear in defocus. Therefore, the combined response is intrinsically linear through relatively small ranges of defocus. In other words, one of the characteristics of the phase shift target subtracted from one of the characteristics of the bright field or dark field target yields a response that is substantially monotonic in focus of the lithography process. In addition, one of the characteristics of the phase shift target subtracted from one of the characteristics of the bright field or dark field target yields a response that varies substantially linearly with focus of the lithography process. Furthermore, the combined response is typically most sensitive for phase shifts near about 90°.

Since the combined response varies nearly monotonically and linearly with one or more parameters (e.g., focus and dose) of a lithography process, the combined response is particularly suitable for use in advanced process control (APC). Furthermore, since the test structure has the precision and accuracy desirable for feedback correction of focus error in lithography cells and for feedforward correction of focus-induced critical dimension error in etching cells, the test structure can be used as a lithographic focus monitor for semiconductor manufacturing. Therefore, one advantage of the test structure shown in FIG. 3 over other test structures is the use of at or near design rule targets for high device correlation and simultaneous, independent, and monotonic determination of both dose and focus for APC. As such, the test structure shown in FIG. 3 also provides many of the advantages of APC such as reduced process variation, accelerated shrinks, elimination of send-ahead wafers, few monitor wafers, shorter response times, reduced scrap, better tool matching, improved overall equipment effectiveness, faster ramp to yield, lower parametric yield loss, better device performance, and easier process transfer from site to site.

In this manner, one or more characteristics of the bright field, dark field, and phase shift targets can be used to determine correction terms for one or more parameters (e.g., dose and focus) of the lithography process. Preferably, the correction terms when applied to the lithography process bring the lithography process back into spec or closer to targeted performance. The correction terms may be applied to the lithography process before additional wafers are printed using the lithography process. As such, the lithography process may be corrected using a feedback control technique.

One or more characteristics of the bright field, dark field, and phase shift targets can also be used to determine one or more parameters of an etch process. In another embodiment, the characteristic(s) of the targets may be used to determine correction terms for one or more parameters of an etch process. In this manner, the characteristic(s) of the targets can be used to determine one or more parameters (or correction terms for the one or more parameters) of an etch process to be performed on wafers on which the test structure is printed. As such, one or more parameters of the etch process may be altered using a feedforward control technique. In one embodiment, the characteristic(s) of the targets can be used to compensate for errors of the lithography process. For example, the characteristic(s) of the targets can be used to determine the errors (e.g., focus error) of the lithography process and the critical dimensions of device structures that can be expected from a lithography process with such errors. In addition, the expected critical dimensions of the lithography process can be used to determine expected critical dimension error of the etch process due to the critical dimension error of the lithography process. In this manner, one or more parameters of the etch process may be corrected for the expected critical dimension error using a feedforward control technique.

Further advantages of the test structures are provided due to the type of metrology tools that may be used to provide meaningful measurements of the test structure. For example, as described above, the test structure may be measured with an overlay metrology tool. Therefore, the measurements of the test structure may be provided much quicker than if other metrology tools are used such as electrical testing tools or CD SEMs. In this manner, the test structures can be measured using a high-throughput, optical overlay tool thereby minimizing the time to data, analysis, and corrective action. In addition, relatively quick metrology tools can have a profound impact on factory revenues particularly if they are used, as described herein, for APC purposes. In particular, gate CD control in lithography is a particularly important APC application since gate CDs predict the speed binning and average selling price of advanced microprocessors. In this scenario, the test structure shown in FIG. 3 in combination with overlay metrology tools become "value-added," where the metric for value is the increase in revenue generated by the product. In the microprocessor case, model-based gate control loops have been shown to add as much as $2,000,000 per 1000 wafer starts.

The test structure may also advantageously be used to monitor and correct one or more parameters of a lithography and/or etch process within a field and from field to field across a wafer. For example, errors in the lithography process (e.g., dose and/or focus errors) can be determined within a field and from field to field across a wafer from measurements of the test structure printed at various positions within a field and within a wafer. These errors can be mathematically modeled to determine, for example, lens tilt, field curvature, astigmatism, scan errors, wafer and chuck flatness, the impact of lens heating and barometric pressure, and other focus anomalies. Field-to-field correction of a lithography process may be performed as described in U.S. Pat. No. 6,689,519 to Brown et al., which is incorporated by reference as if fully set forth herein.

Figure 4:
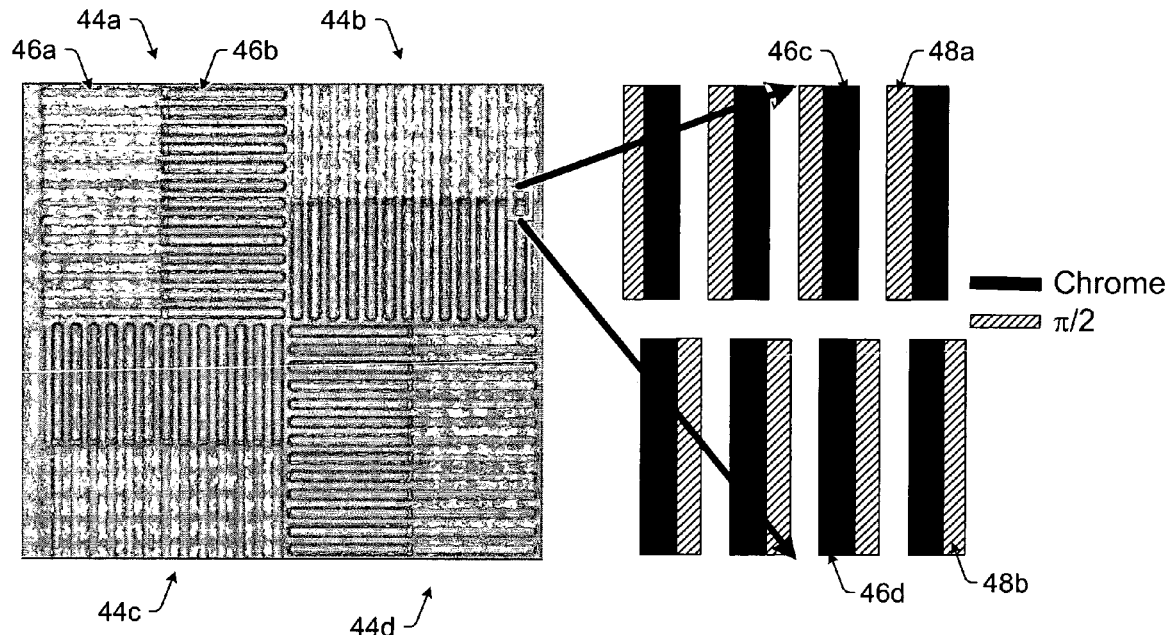

FIG. 4 illustrates another embodiment of a portion of a test structure that may be used as a monitor for a lithography process. The test structure is shown in FIG. 4 and described herein as being formed on a reticle. However, it is to be understood that the test structure may also be formed on a wafer (e.g., by imaging the reticle on the wafer). The test structure may be configured as described above, except that the grating structures of the phase shift target includes sets of segmented structures. In this manner, the test structure or "target" may be generally referred to as an AIM PSF target since the target is an extension of the Archer AIM grating-overlay technology that is commercially available from KLA-Tencor, but it incorporates phase targets as part of the segmentation of the typical grating line structures as described further herein. In this embodiment, the grating structures of the bright field and dark field targets (not shown) may also include sets of segmented structures. For example, FIG. 4 illustrates one general design of a target that may be configured as a bright field target, a dark field target, or a phase shift target with appropriate changes to the features in the target (e.g., lines or spaces) and with addition or removal of phase shifting features. Therefore, a test structure as described herein may include three different targets, each of which have the general structure shown in FIG. 4.

In particular, the phase shift target as shown in FIG. 4 includes four subsets of grating structures. The subsets of grating structures that are diagonally opposed to one another are arranged in approximately the same direction. The other subsets of grating structures are arranged in approximately the same direction, which is perpendicular to that of the other subsets. For example, as shown in FIG. 4, subsets 44a and 44d are arranged in the same direction. In other words, grating structures of subsets 44a and 44d extend lengthwise in the same direction. In addition, subsets 44b and 44c are arranged in the same direction such that grating structures of subsets 44b and 44c extend lengthwise in the same direction. The direction of subsets 44b and 44c is substantially perpendicular to that of subsets 44a and 44d.

Although the target is shown to include four subsets of structures, it is to be understood that the target may include a different number of structures. Preferably, the target includes at least two subsets of structures, which are arranged in substantially perpendicular directions. In addition, although the target is shown to include grating structures that include lines or spaces, it is to be understood that the target may include any other suitable structures that are known in the art.

The subsets of grating structures are segmented such that each grating structure includes at least two segments, as shown in FIG. 4. For example, subset 44a of grating structures includes segments 46a and 46b. In addition, each of the segments of the structure may be further segmented into any number of finely segmented sections (not shown) such that LES type measurements may be performed as described above. The segments (e.g., segments 46a and 46b) provide additional flexibility in the target design and the types or number of measurements that may be performed on the test structure. For example, as shown in FIG. 4, segments 46c and 46d of subset 44b include chrome lines on the reticle. In addition, both segments 46c and 46d are phase shifted. For example, the reticle includes phase shifting features 48a and 48b, which are also segmented in substantially the same manner as the chrome lines. However, segments 46c and 46d are phase shifted in different directions (e.g., x and y). Therefore, measurements of segments 46c may be subtracted from measurements of 46d and used to determine focus error of a lithography process (since the phase shifting of the segments with respect to one another is known). Alternatively, measurements of segments 46c and/or 46d may be subtracted from measurements of non-shifted grating structures of the bright field or dark field target and used to determine focus error of the lithography process. In addition, since the target may include phase shifted grating structures that are arranged in both the x and y directions (e.g., as in subsets 44a and 44b), the target measurements may be used as described above to determine focus error in both the x and y directions at the same time.

Phase shifting features 48a and 48b may include any suitable phase shifting features known in the art. In addition, as shown in FIG. 4, the phase shifting features may be configured to shift the phase of the segments 46c and 46d by 180°. However, it is to be understood that the phase shifting features may be configured to shift the phase of the segments by any suitable fixed number of degrees (e.g., 90°).

Additional examples of targets that include segmented structures are illustrated in International Publication Nos. WO 02/19415 to Adel et al. and WO 03/071471 to Adel et al. and U.S. Patent Application Publication Nos. 2003/0021465 to Adel et al., 2003/0021466 to Adel et al., 2003/0021467 to Adel et al., 2003/0026471 to Adel et al., 2003/0223630 to Adel et al., which are incorporated by reference as if fully set forth herein. The target shown in FIG. 4 may be further configured as described in these publications. In addition, the measurements described in these publications may be used in the methods described herein.

Figure 5:
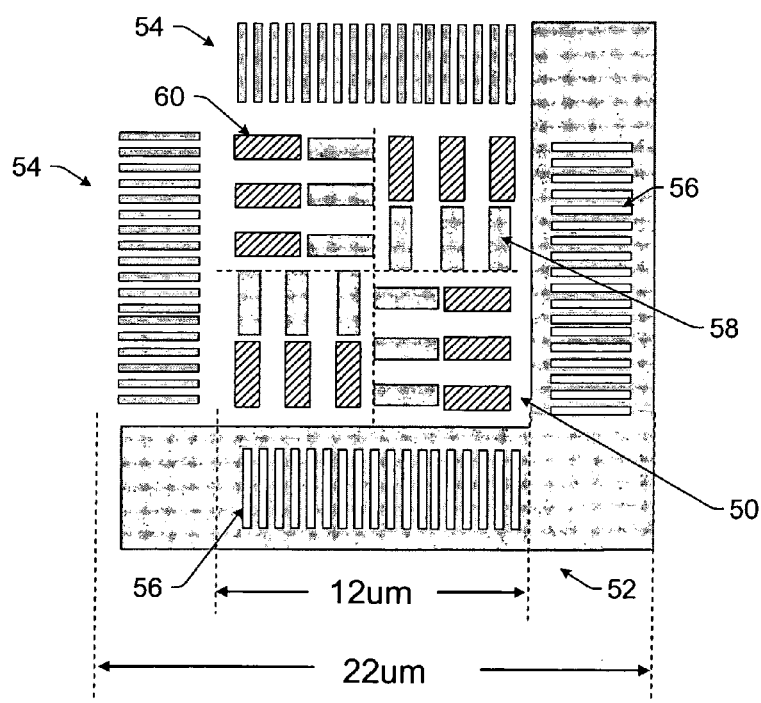

FIG. 5 illustrates another embodiment of a portion of a test structure that may be used as a monitor as described further herein. In particular, this test structure may be formed on a wafer as a monitor for a lithography process. This test structure may be commonly referred to as a "Micro AIM/MPX" target since it includes LES structures and overlay targets that are particularly suitable for measurement by the Archer AIM tool that is commercially available from KLA-Tencor and since it is relatively small in size. The Micro AIM/MPX target may include inner regions 50 and outer regions 52 for the measurement of overlay, lithographic dose, and lithographic defocus. Inner region 50 may have dimensions of about 12 μm×about 12 μm. Outer region 52 may have dimensions of about 22 μm×about 22 μm.

Outer region 52 includes LES structures. One or more characteristics of the LES structures can be measured and used to determine one or more parameters of the lithography process. In one embodiment, outer region 52 includes bright field LES measurement structures 54 and dark field LES measurement structures 56, both of which may be configured as described further herein. The duplication of the bright field and dark field LES measurement structures in the x and y orientations allows LES targets with different pitches and/or duty cycles to be included in the test structure. Measurements of different pitch and/or duty cycle targets may be used to resolve the ambiguity between positive and negative focus shifts.

Inner region 50 includes current layer structures 58 and previous layer structures 60 that can be used to measure pattern overlay. For example, one or more characteristics of the current layer structures can be measured and used in combination with one or more characteristics of previous layer structures formed in an inner region of an additional test structure formed on the wafer to determine pattern overlay. This embodiment of the test structure may be further configured as described herein. This embodiment of a test structure may be used in any of the method embodiments described herein.

The test structure shown in FIG. 5 has all of the advantages described above. The test structure shown in FIG. 5 is also advantageous in that the test structure addresses the measurement throughput disadvantages associated with separate measurements of different targets for pattern overlay and lithographic defocus. In particular, the Micro AIM/MPX test structures described herein can be used to simultaneously provide information on in-device pattern overlay, lithographic dose, and lithographic defocus using an optical overlay metrology tool. In some cases, this improvement can more than double the effective measurement throughput of a metrology tool and cut the cost per measurement in half.

In addition, the relatively small size of the test structures (e.g., about 22 µm×about 22 µm) permits use of the test structure inside of the semiconductor device area. In other words, the test structure may be formed inside of a semiconductor device area on the wafer. It is also believed that the test structure described herein is the only target of its kind that can provide the measurements described herein inside the device area using an optical imaging overlay metrology tool.

Furthermore, the similarity of the test structures to dummy structures that may also be formed on a wafer allows prevention of dishing and erosion of the test structures during chemical-mechanical planarization (CMP) thereby making the test structures exceptionally robust with respect to process-induced distortion. In one such embodiment, the one or more characteristics of the LES structures and the current layer structures are substantially the same as one or more characteristics of dummy structures formed on the wafer.

Figure 6:
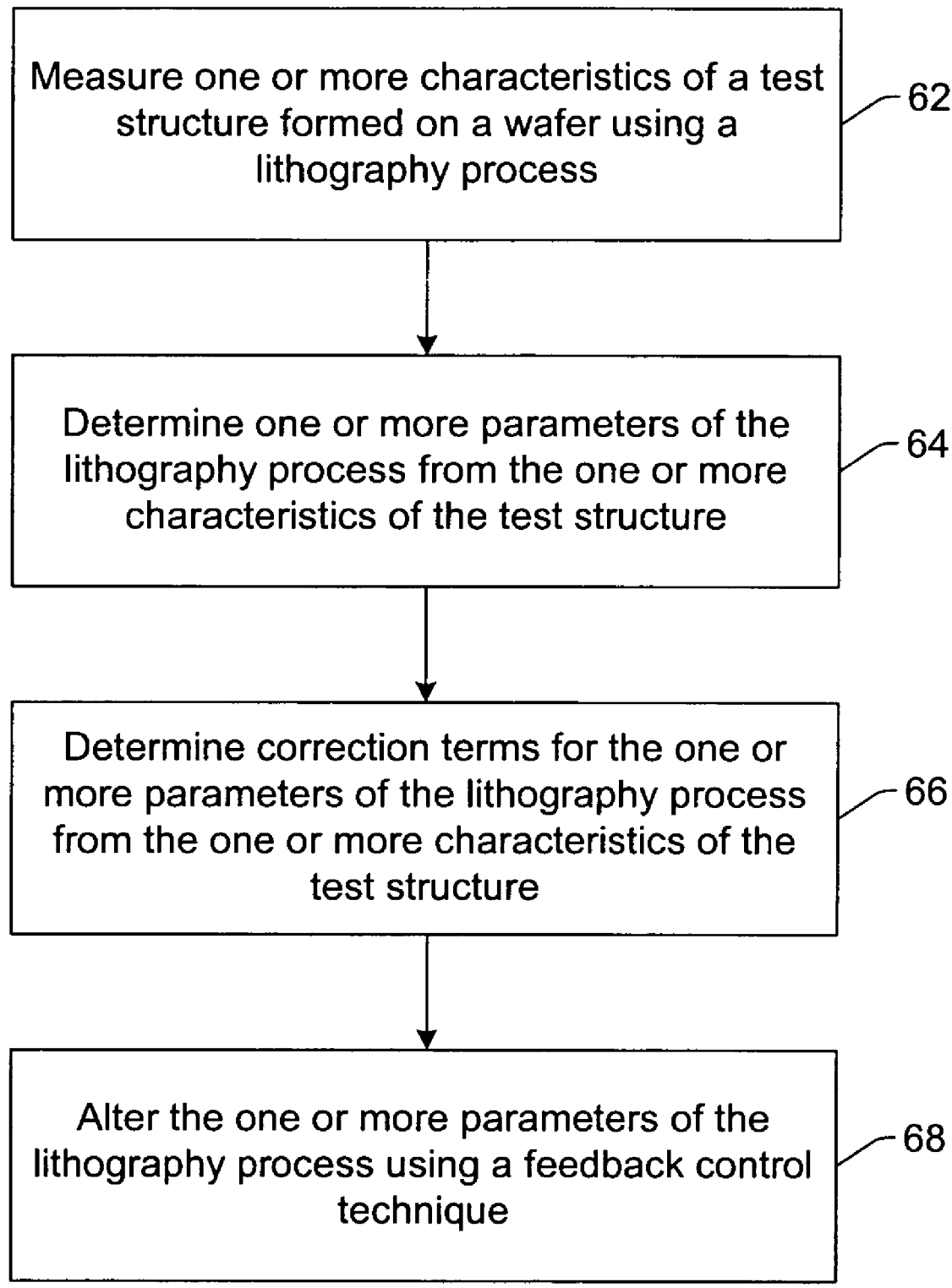
FIG. 6 illustrates one embodiment of a method for monitoring a lithography process.

FIG. 6 illustrates one embodiment of a method for monitoring a lithography process. The method includes measuring one or more characteristics of a test structure formed on a wafer using the lithography process, as shown in step 62. The test structure may be configured as described above. The lithography process may include any suitable lithography process known in the art. Measuring the characteristic(s) of the test structure may be performed as described above. For example, the characteristic(s) may be measured using a metrology overlay tool such as one of the Archer tools. In addition, the measurements performed in step 62 may include LES-type measurements.

The method also includes determining one or more parameters of the lithography process from the one or more characteristics of the test structure, as shown in step 64. For example, the parameter(s) of the lithography process may include focus (or focus error). Focus of the lithography process may be determined as described above, for example, by subtracting the measurements of a phase shifted target from those of a non-phase shifted target or a target that has some reference phase shift. Focus of the lithography process may also be determined in both the x and y directions from measurements of the test structure as described above. In addition, or alternatively, the parameter(s) of the lithography process may include dose (or exposure dose error). Dose may be determined as described above, for example, using measurements of structures of the bright field target and/or the dark field target. The parameter(s) of the lithography process that may be determined may also include overlay as described further above. Other parameters of the lithography process may also be determined including, for example, scanner lens aberrations, within field variation, within wafer variation, etc. In addition, more than one parameter of the lithography process may be determined substantially simultaneously (e.g., dose and focus errors or dose, focus, and overlay errors).

As further described above, the determined parameter(s) of the lithography process may be used to monitor for process excursions. However, the determined parameter(s) may also be used for other purposes such as engineering purposes and/or APC purposes. In particular, since the response of the test structure varies substantially monotonically and substantially linearly in focus and dose of the lithography process, the determined parameter(s) may be used to control the lithography process. For example, in one embodiment, the method may include determining correction terms for the one or more parameters of the lithography process from the one or more characteristics of the test structure, as shown in step 66. The corrections terms may include correction terms for the focus, dose, any other controllable parameter of the lithography process (e.g., post exposure bake temperature), or some combination thereof. In addition, the method may include altering the one or more parameters of the lithography process using a feedback control technique, as shown in step 68. In this manner, the parameter(s) of the lithography process may be altered prior to printing additional wafers with the process. Preferably, the parameter(s) of the lithography process are altered to bring characteristics of device structures printed by the lithography process back into spec or as close to optimum characteristics as possible. The method shown in FIG. 6 may include any other step(s) described herein.

Figure 7:
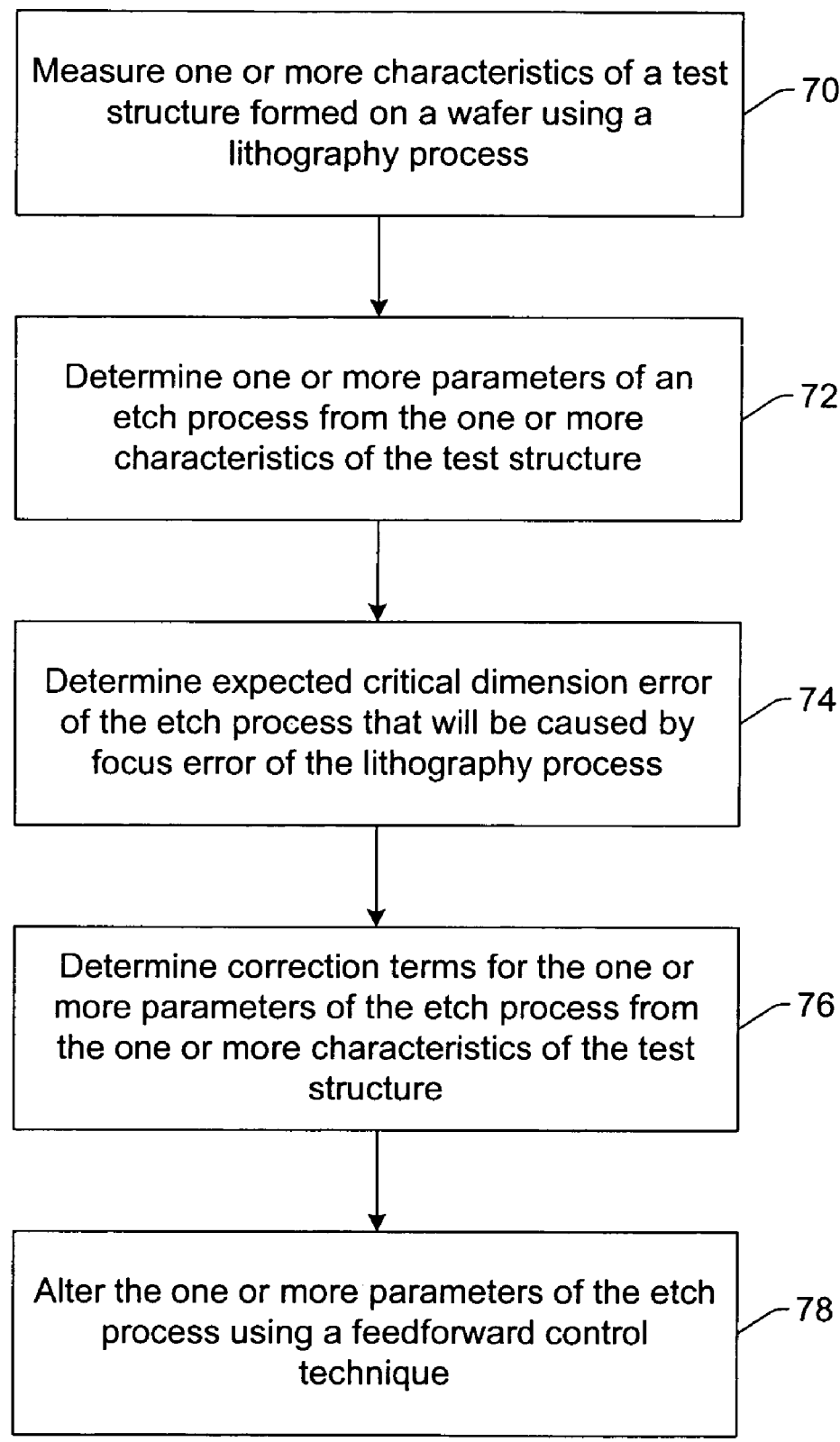
FIG. 7 illustrates one embodiment of a method for controlling an etch process.

FIG. 7 illustrates one embodiment of a method for controlling an etch process. As shown in step 70, the method includes measuring one or more characteristics of a test structure formed on a wafer using a lithography process. The test structure may be configured as described herein. In addition, the test structure may be formed on the wafer using any lithography process known in the art, and preferably a lithography process that is selected or designed to print other features (e.g., device structures) on the wafer. Measuring the characteristic(s) of the test structure may be performed as described above. In addition, the measurements performed in step 70 may include LES-type measurements.

The method also includes determining one or more parameters of an etch process from the one or more characteristics of the test structure, as shown in step 72. For example, characteristic(s) of the test structure may be used to determine parameter(s) of the lithography process such as focus and/or dose error. Therefore, the characteristic(s) of the test structure or the determined parameter(s) of the lithography process may be used to determine one or more characteristics of device structures that are also printed on the wafer by the lithography process. The characteristic(s) of the device structures may be used to determine parameter(s) of the etch process. The parameter(s) of the etch process or any of the other characteristics and/or parameters that are determined using this method may also be used for engineering and/or APC purposes.

In one such embodiment, the method may include determining expected critical dimension error of the etch process that will be caused by focus error of the lithography process, as shown in step 74. The method may also include determining correction terms for the one or more parameters of the etch process from the one or more characteristics of the test structure, as shown in step 76. The correction terms may be determined for any controllable parameter of the etch process (e.g., etch time, etchant gases, etch rate, power, pressure, etc.). Preferably, the correction terms are determined such that application of the correction terms to the parameter(s) of the etch process reduces the expected critical dimension error (or other error) of the etch process. In addition, the method may include altering the one or more parameters of the etch process using a feedforward control technique, as shown in step 78. In this manner, the parameter(s) of the etch process may be altered prior to etching of the wafer by the etch process. The parameter(s) of the etch process may be altered using the correction terms determined in step 76. The method shown in FIG. 7 may include any other step(s) described herein. In addition, the method described above may be used to control other semiconductor fabrication processes in a similar manner using either a feedback control technique or a feedforward control technique.

Program instructions implementing methods such as those described herein may be transmitted over or stored on a carrier medium. The carrier medium may be a transmission medium such as a wire, cable, or wireless transmission link. The carrier medium may also be a storage medium such as a read-only memory, a random access memory, a magnetic or optical disk, or a magnetic tape.

In an embodiment, a processor may be configured to execute the program instructions to perform a computer-implemented method according to the above embodiments. The processor may take various forms, including a personal computer system, mainframe computer system, workstation, network appliance, Internet appliance, personal digital assistant ("PDA"), television system or other device. In general, the term "computer system" may be broadly defined to encompass any device having one or more processors, which executes instructions from a memory medium.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

Figure 8:
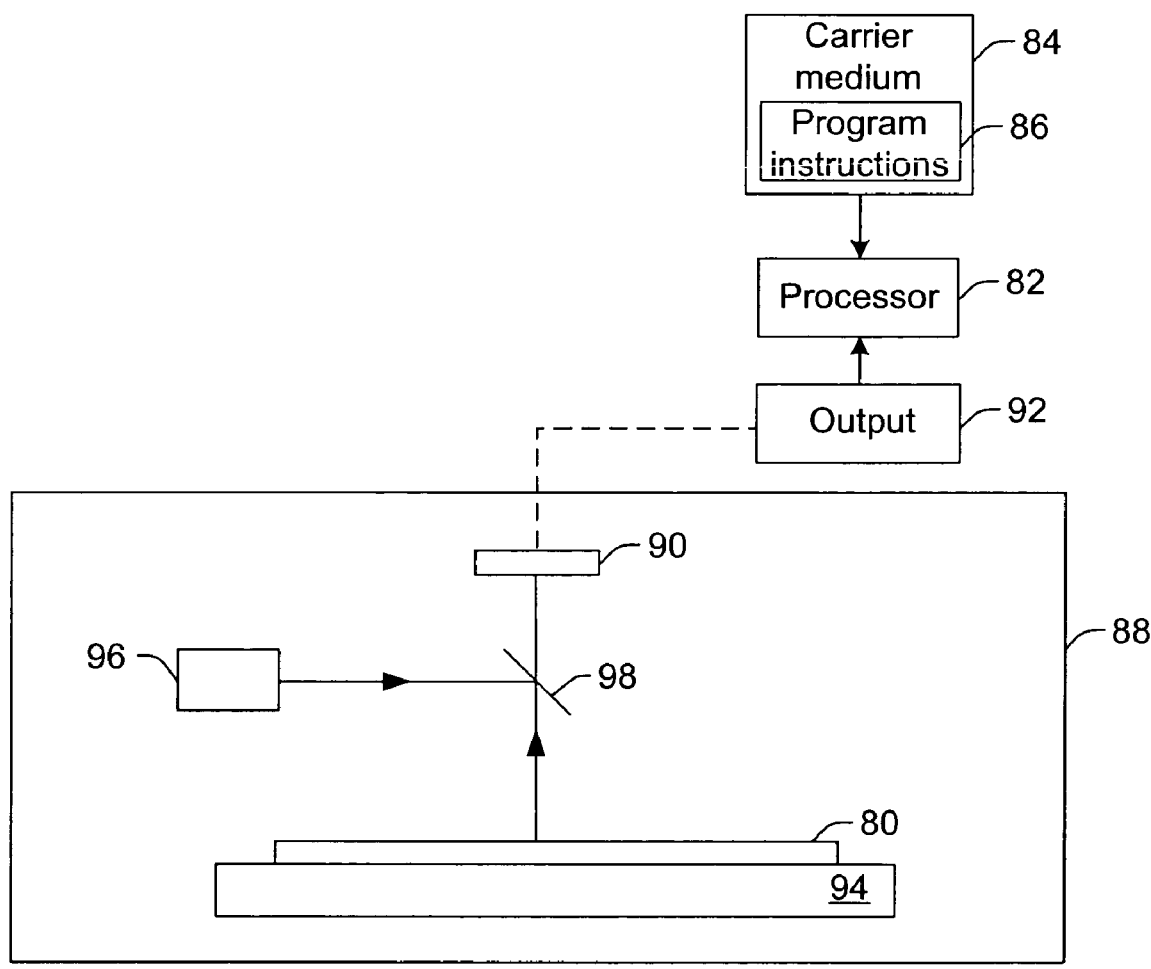
FIG. 8 is a schematic diagram illustrating a side view of one embodiment of a system configured to monitor and/or control a semiconductor fabrication process such as a lithography process or an etch process.

FIG. 8 illustrates one embodiment of a system configured to measure one or more characteristics of a bright field target, a dark field target, and a phase shift target formed on wafer 80. The system includes processor 82. The processor may include any suitable processor known in the art as described above. In addition, the processor may be an image computer or a parallel processor. The system also includes carrier medium 84. The carrier medium may be configured as described above. For example, carrier medium 84 includes program instructions 86, which are executable on processor 82. The program instructions may be executable for performing any of the embodiments of the methods described above. The program instructions may be further configured as described above.

In some embodiments, the system may also include overlay metrology tool 88. Overlay metrology tool 88 may be configured to measure one or more characteristics of a test structure formed on wafer 80. Overlay metrology tool 88 may be coupled to processor 82. For example, one or more components of overlay metrology tool 88 may be coupled to processor 82 by a transmission medium (not shown). The transmission medium may include "wired" and "wireless" portions. In addition, the transmission medium may include any suitable transmission medium known in the art. In another example, detector 90 of overlay metrology tool 88 may be configured to generate output 92. The output may be transmitted across a transmission medium (not shown) from detector 90 to processor 82. In some embodiments, the output may also be transmitted through one or more electronic components (not shown) coupled between the detector and the processor. Therefore, output 92 is transmitted from the overlay metrology tool to the processor, and program instructions 86 may be executable on the processor to determine one or more parameters of the lithography process (e.g., dose, focus, overlay or some combination thereof) using the measured characteristic(s) of the test structure as described herein using output 92. Program instructions 86 may be further executable on the processor to perform other functions described herein (e.g., determine corrections terms for a lithography process, determine correction terms for an etch process, etc.).

Overlay metrology tool 88 may be configured to perform measurements of the test structure using any technique known in the art. For example, the overlay metrology tool may be configured to function as a coherence probe microscope (CPM). In addition, the overlay metrology tool includes stage 94 upon which wafer 80 may be disposed during measurements. The stage may include any suitable mechanical or robotic assembly known in the art. The overlay metrology tool also includes light source 96. Light source 96 may include any appropriate light source known in the art. In addition, the overlay metrology tool may include beam splitter 98, which is configured to direct light from light source 96 onto wafer 80 at angles that are approximately normal to an upper surface of wafer 80. The beam splitter may include any suitable beam splitter known in the art. The overlay metrology tool further includes detector 90, which is configured to detect light transmitted by beam splitter 98. The detector is also configured to generate output 92. The detector may include any of the detectors described above or any other suitable detector known in the art.

Although one general configuration of the overlay metrology tool is shown in FIG. 8, it is to be understood that the overlay metrology tool may have any suitable configuration known in the art. For example, the overlay metrology tool may include one of the Archer tools that are commercially available from KLA-Tencor. In addition, the overlay metrology tool may include other optical systems such as optical imaging systems, ellipsometer-based systems, scatterometer-based systems, etc. or e-beam systems such as a CD SEM.

Further modifications and alternative embodiments of various aspects of the invention may be apparent to those skilled in the art in view of this description. For example, test structures and methods for monitoring or controlling a semiconductor fabrication process are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A test structure formed on a wafer as a monitor for a lithography process, comprising:
   a bright field target comprising first grating structures;
   a dark field target comprising second grating structures, wherein the first and second grating structures have one or more characteristics that are substantially the same as one or more characteristics of device structures formed on the wafer; and
   a phase shift target having characteristics that are substantially the same as one or more of the characteristics of the bright field or dark field target except that grating structures of the phase shift target are shifted in optical phase from the first or second grating structures, wherein one or more of the characteristics of the bright field, dark field, and phase shift targets can be measured and used to determine one or more parameters of the lithography process, wherein the grating structures of the phase shift target comprise sets of segmented structures such that each of the grating structures of the phase shift target comprises at least two segmented structures, and wherein first and second segmented structures of each grating structure of the phase shift target comprise first and second shorter sides, respectively, that are parallel to each other and face each other across a space separating the first and second shorter sides.

2. The test structure of claim 1, wherein the one or more characteristics of the first and second grating structures that are substantially the same as the one or more characteristics of the device structures comprise lateral dimension.

3. The test structure of claim 1, wherein the one or more parameters of the lithography process comprise dose, focus, or dose and focus.

4. The test structure of claim 1, wherein the one or more parameters of the lithography process comprise focus in the x direction and focus in the y direction.

5. The test structure of claim 1, wherein one of the characteristics of the phase shift target subtracted from one of the characteristics of the bright field target or the dark field target yields a response that is substantially monotonic in focus of the lithography process.

6. The test structure of claim 1, wherein one of the characteristics of the phase shift target subtracted from one of the characteristics of the bright field target or the dark field target yields a response that varies substantially linearly with focus of the lithography process.

7. The test structure of claim 1, wherein the one or more of the characteristics of the bright field target and the dark field target can further be used to determine dose of the lithography process, and wherein the one or more of the characteristics of the phase shift target and the bright field or dark field target can further be used to determine focus of the lithography process.

8. The test structure of claim 1, wherein the one or more of the characteristics of the bright field, dark field, and phase shift targets can further be used to determine correction terms for the one or more parameters of the lithography process.

9. The test structure of claim 1, wherein the one or more of the characteristics of the bright field, dark field, and phase shift targets can further be used to determine one or more parameters of an etch process.

10. The test structure of claim 1, wherein the one or more of the characteristics of the bright field, dark field, and phase shift targets can further be used to determine correction terms for one or more parameters of an etch process.

11. A test structure formed on a reticle as a monitor for a lithography process, comprising:
   a bright field target comprising first grating structures;
   a dark field target comprising second grating structures, wherein the first and second grating structures have one or more characteristics that are substantially the same as one or more characteristics of device structures formed on the reticle; and
   a phase shift target having characteristics that are substantially the same as one or more characteristics of the bright field or dark field target except that grating structures of the phase shift target are shifted in optical phase from the first or second grating structures, wherein one or more of the characteristics of the bright field, dark field, and phase shift targets can be measured and used to determine one or more parameters of the lithography process, wherein the grating structures of the phase shift target comprise sets of segmented structures such that each of the grating structures of the phase shift target comprises at least two segmented structures, and wherein first and second segmented structures of each grating structure of the phase shift target comprise first and second shorter sides, respectively, that are parallel to each other and face each other across a space separating the first and second shorter sides.

12. A method for monitoring a lithography process, comprising:
   measuring one or more characteristics of a test structure formed on a wafer using the lithography process, wherein the test structure comprises:
      a bright field target comprising first grating structures;
      a dark field target comprising second grating structures, wherein the first and second grating structures have one or more characteristics that are substantially the same as one or more characteristics of device structures formed on the wafer; and
      a phase shift target having characteristics that are substantially the same as one or more of the characteristics of the bright field or dark field target except that grating structures of the phase shift target are shifted in optical phase from the first or second grating structures, wherein the grating structures of the phase shift target comprise sets of segmented structures such that each of the grating structures of the phase shift target comprises at least two segmented structures, and wherein first and second segmented structures of each grating structure of the phase shift target comprise first and second shorter sides, respectively, that are parallel to each other and face each other across a space separating the first and second shorter sides; and
   determining one or more parameters of the lithography process from the one or more characteristics of the test structure.

13. The method of claim 12, further comprising determining correction terms for the one or more parameters of the lithography process from the one or more characteristics of the test structure.

14. The method of claim 12, further comprising altering the one or more parameters of the lithography process using a feedback control technique.

15. The method of claim 12, wherein the one or more parameters comprise focus error.

16. A method for controlling an etch process, comprising:
   measuring one or more characteristics of a test structure formed on a wafer using a lithography process, wherein the test structure comprises:
      a bright field target comprising first grating structures;
      a dark field target comprising second grating structures, wherein the first and second grating structures have one or more characteristics that are substantially the same as one or more characteristics of device structures formed on the wafer; and
      a phase shift target having characteristics that are substantially the same as one or more of the characteristics of the bright field or dark field target except that grating structures of the phase shift target are shifted in optical phase from the first or second grating structures, wherein the grating structures of the phase shift target comprise sets of segmented structures such that each of the grating structures of the phase shift target comprises at least two segmented structures. and wherein first and second segmented structures of each grating structure of the phase shift target comprise first and second shorter sides, respectively, that are parallel to each other and face each other across a space separating the first and second shorter sides; and
   determining one or more parameters of the etch process from the one or more characteristics of the test structure.

17. The method of claim 16, further comprising determining correction terms for the one or more parameters of the etch process from the one or more characteristics of the test structure.

18. The method of claim 16, further comprising altering the one or more parameters of the etch process using a feedforward control technique.

19. The method of claim 16, further comprising determining expected critical dimension error of the etch process that will be caused by focus error of the lithography process.

20. A test structure formed on a wafer as a monitor for a lithography process, comprising:
an outer region comprising line end shortening structures, wherein one or more characteristics of the line end shortening structures can be measured and used to determine one or more parameters of the lithography process; and
an inner region comprising current layer structures, wherein one or more characteristics of the current layer structures can be measured and used in combination with one or more characteristics of previous layer structures formed in an inner region of an additional test structure formed on the wafer to determine pattern overlay, and wherein one or more characteristics of the line end shortening structures are different than one or more characteristics of the current layer structures.

21. The test structure of claim 20, wherein the one or more characteristics of the line end shortening structures and the current layer structures can be measured to simultaneously determine the one or more parameters of the lithography process and the pattern overlay.

22. The test structure of claim 20, wherein the one or more parameters of the lithography process comprise lithographic dose and lithographic defocus.

23. The test structure of claim 20, wherein the line end shortening structures comprise bright field line end shortening structures and dark field line end shortening structures.

24. The test structure of claim 20, wherein the line end shortening structures are oriented in the x and y directions.

25. The test structure of claim 20, wherein the line end shortening structures comprise line end shortening structures having different pitches, different duty cycles, or different pitches and different duty cycles.

26. The test structure of claim 20, wherein the one or more characteristics of the line end shortening structures and the current layer structures can be measured using an optical imaging overlay metrology tool.

27. The test structure of claim 20, wherein the test structure is formed inside of a semiconductor device area on the wafer.

* * * * *